US006717405B2

(12) United States Patent
Alsop

(10) Patent No.: US 6,717,405 B2
(45) Date of Patent: Apr. 6, 2004

(54) ARTERIAL SPIN LABELING USING TIME VARYING GRADIENTS

(75) Inventor: David Alsop, Newton, MA (US)

(73) Assignee: Beth Israel Deaconess Medical Center, Inc., Boston, MA (US)

( * ) Notice: Subject to any disclaimer, the term of this patent is extended or adjusted under 35 U.S.C. 154(b) by 0 days.

(21) Appl. No.: 10/121,963

(22) Filed: Apr. 12, 2002

(65) Prior Publication Data

US 2003/0193334 A1 Oct. 16, 2003

(51) Int. Cl.[7] .................................................. G01V 3/00
(52) U.S. Cl. ........................................................ 324/306
(58) Field of Search ................................ 324/306, 307, 324/309

(56) References Cited

U.S. PATENT DOCUMENTS

| | | | | |
|---|---|---|---|---|
| 4,812,760 A | * | 3/1989 | Bottomley et al. | 324/309 |
| 5,195,524 A | | 3/1993 | Takiguchi et al. | |
| 5,402,785 A | | 4/1995 | Leigh et al. | |
| 5,846,197 A | | 12/1998 | Edelman | |
| 6,188,922 B1 | * | 2/2001 | Mistretta et al. | 600/419 |
| 6,252,399 B1 | * | 6/2001 | Pruessmann et al. | 324/307 |
| 6,271,665 B1 | * | 8/2001 | Berr et al. | 324/306 |
| 6,285,900 B1 | * | 9/2001 | Stuber et al. | 600/410 |
| 6,335,621 B1 | * | 1/2002 | Cho | 324/314 |
| 6,359,436 B1 | * | 3/2002 | Miyamoto et al. | 324/307 |

FOREIGN PATENT DOCUMENTS

WO    WO99/52429    10/1999

OTHER PUBLICATIONS

ALSOP, David Improved Efficiency for Multi–slice Continuous Arterial Spin Labeling Using Time Varying Gradients, Beth Israel Deaconess Medical Center, Department of Radiology, Harvard Medical School, Boston, MA, USA, Apr. 23–27, 2001.

Aguirre, G.K., et al., "Experimental Design and the Relative Sensitivity of BOLD and Perfusion fMRI", NeuroImage, Academic Press, vol. 15, No. 3, Mar. 1, 2002, pp. 488–500.

Alsop, D. & Detre, J., "Multisection Cerebral Blood Flow MR Imaging with Continuous Arterial Spin Labeling," Department of Radiology and Neurology, University of Pennsylvania Medical Center, Philadelphia, PA,8/98, pp. 410–416.

Alsop, D., Arterial Spin Labeling MRI: What Good Is It?, Department of Radiology, Beth Israel Deaconess Medical Center & Harvard Medical School, Boston, MA. Presented at Diffusion & Perfusion MR Study Group Meeting, Glasgow, 2001.

Buxton, R. et al., "A General Kinetic Model for Quantitative Perfusion Imaging with Arterial Spin Labeling," Department of Radiology & Psychiartry, University of San Diego, CA & Beth Israel Hospital, Boston, MA, 1998, by Williams & Wilkins, pp. 383–396.

(List continued on next page.)

*Primary Examiner*—Diego Gutierrez
*Assistant Examiner*—Dixomara Vargas
(74) *Attorney, Agent, or Firm*—Wolf, Greenfield & Sacks, P.C.

(57) ABSTRACT

The present invention relates to a method and system for conducting a magnetic resonance fluid flow study by conducting a labeling procedure and a control procedure and combining datasets from those procedures to create a dataset for the fluid flow study. An amplitude modulated magnetic field gradient and amplitude modulated RF irradiation may be applied during a labeling procedure. Likewise, amplitude modulated RF irradiation may be applied during a control procedure. An amplitude modulated magnetic field gradient may also be applied during the control procedure.

54 Claims, 11 Drawing Sheets

OTHER PUBLICATIONS

Chalela, J. et al., "Magnetic Resonance Perfusion Imaging in Acute Ischemic Stroke Using Continuous Arterial Spin Labeling," Department of Nurology and Radiology, University of Pennsylvania, Philadelphia, PA, Dec. 2, 1999, pp. 680–687.

Gonzalaz, J., Alsop, D., & Detre,J., "Cerebral Perfusion and Arterial Transit Time Changes During Task Activiation Determined with Continuous Arterial Spin Labeling," Department of Neurology and Radiology, University of Pennsylvania, Philadelphia, PA, Jan. 19, 2000, Wiley–Liss Inc., pp. 730–748.

Pruessmann, X. et al., "RF Pulse Concatenation for Spacially Selective Inversion," Institute of Biomedical Engineering and Medical Informatics, et al., Apr. 12, 2000 by Academic Press, pp. 58–65.

Ye, F. et al., "Noise Reduction in 3D Perfusion Imaging by Attenuating the Static Signal in Arterial Spin Tagging (ASSIST)", Magnetic Resonance in Medicine, 44–92–100, 2000, Wiley–Liss, Inc.

"Table of Contents", "The Basics of MRI",http//www.cis-.rit.edu/htbooks/mri/contents.htm , 1996–2000, J. P. Hornak, pp. 1–3.

Chapter 1, Introduction, "The Basics of MRI", , http://www.cis.rit.edu/htbooks/mri/chap–1/chap–1.htm, 1996–2000, J. P. Hornak, pp. 1–3.

Chapter 3, "Spin Physics", "The Basics of MRI", http://www.cis.rit.edu/htbooks/mri/chap–3/chap–3.htm, 1996–2000, J. P. Hornak, pp. 1–8.

Chapter 4, "NMR Spectroscopy", "The Basics of MRI", http://www.cis.rit.edu/htbooks/mri/chap–4/chap–4.htm , 1996–2000, J. P. Hornak, pp. 1–3.

Chapter 8, "Basic Imaging Techniques", http://www.cis.rit-.edu/htbooks/mri/chap–8/chap–8.htm, 1996–2000, J. P. Hornak, pp. 1–7.

* cited by examiner

ARTERIAL SPIN LABELING USING TIME VARYING GRADIENTS

GOVERNMENT SUPPORT

This work was funded in part in part by grant number 1RO1 AG 19599-01 from the National Institutes of Health. Accordingly, the Government may have certain rights to this invention.

FIELD OF THE INVENTION

The present application relates to a technique for imaging fluid flow noninvasively using MRI with radio frequency arterial spin labeling and, more particularly, to a labeling technique that permits extension of this technique to a multislice or volume examination.

BACKGROUND OF THE INVENTION

Magnetic Resonance Imaging (MRI) is an imaging technique used primarily in medical settings to produce high quality images of the inside of the human body. MRI is based on principles of nuclear magnetic resonance (NMR), a spectroscopic technique used to obtain microscopic chemical and physical information about molecules.

MR (magnetic resonance) techniques may be used to study fluid flow, such as, for example, blood flow and blood perfusion in tissue. One of many possible applications is to study blood perfusion in the human brain.

Typically, during MR studies, images are taken of a volume of interest or of "slices" in a region of interest. A slice may be defined as a relatively thin region, which may be imaged in a single image. Each slice is said to be composed of several volume elements called voxels. Traditionally, volume of a voxel may be approximately 3 mm^3, however, it may vary depending on the application. The magnetic resonance image is said to be composed of several picture elements called pixels. The intensity of a pixel is proportional to the NMR signal intensity of the contents of the corresponding volume element, or voxel, of the object being measured. Present-day MR studies typically call for more than one slice image to be taken, or one or more images of the volume of the region of interest to be taken.

Magnetic resonance imaging is based on the absorption and emission of energy in the radio frequency range of the electromagnetic spectrum. The human body, for example, is composed in large part of water, which has many hydrogen atoms. Hydrogen nuclei have an NMR signal in the presence of the magnetic field, and after being perturbed by RF (radiofrequency) irradiation. Protons in the hydrogen atoms (and in other atoms) possess a property called spin, which can be thought of as a small magnetic field and which will cause the nucleus to produce an NMR signal. Water consists in large part of hydrogen atoms. There are known apparatuses for detecting water in tissue using the NMR signal of hydrogen nuclei. Using these basic principles, fluid content may be measured in a variety of substances or tissues.

In order to detect fluid flow or perfusion in a particular region of interest, fluid flowing into that region may be "labeled" by reversing, or perturbing, the spins of the protons of the fluid in some region that is "upstream" from the region of interest, and then detecting the labeled fluid when it flows through or is perfused in the region of interest.

Such studies have previously been performed by applying a constant magnetic field to the fluid and applying RF irradiation to label the spins. In order to spatially isolate labeling areas, a magnetic field gradient may be used. Spatially isolating a particular area means applying, in the particular area, a magnetic field different in strength from the magnetic field in other areas. By using the magnetic field gradient to spatially isolate particular areas, only fluid in a predetermined region may be labeled. However, magnetization transfer effects and other unrelated errors may interfere with the procedure by causing more than just the "upstream" fluid to be labeled. In order to account for such effects, a control procedure may be used, where a magnetic field gradient and RF irradiation are applied so as not to label the spins, but to mimic the unrelated effects.

One of the concerns in performing such a study is possible power deposition resulting from application of RF irradiation. Typically, power deposition is higher where the present magnetic field and the intensity of RF irradiation are higher. There are boundaries on the power that may be deposited in the human body without harming the body. However, stronger RF irradiation results in higher sensitivity that in turn produces better results. Therefore, there is a need for a higher-sensitivity method for performing fluid flow studies, especially multi-slice or volume studies, in the presence of strong magnetic fields, while taking into account maximum power deposition considerations.

SUMMARY OF THE INVENTION

The present invention relates to a method and apparatus for conducting a magnetic resonance fluid flow study by conducting a labeling procedure and a control procedure and combining datasets from those procedures to create a dataset for the fluid flow study. An amplitude modulated magnetic field gradient and amplitude modulated RF irradiation may be applied during a labeling procedure. Likewise, amplitude modulated RF irradiation may be applied during control procedure. An amplitude modulated magnetic field gradient may also be applied during the control procedure.

An envelope for modulating the label RF irradiation may be an absolute value of an envelope for modulating the control RF irradiation, such that an average amplitude for the label RF irradiation is not zero. The average amplitude for the label RF irradiation may be positive or negative, depending on the requirements of a particular application. An average amplitude for control RF irradiation may be zero or near zero.

An amplitude modulated magnetic field gradient may also be applied during the control procedure. An envelope for modulating the control magnetic field gradient may be similar to the envelope for modulating control RF irradiation.

The control RF irradiation may further be frequency modulated. An envelope for frequency modulation of the control RF irradiation may be similar to the envelope for amplitude modulation of the control RF irradiation. In one embodiment of the invention, the envelope for amplitude modulation of the control RF irradiation may be a modified square wave. The envelope for the label RF irradiation may be the absolute value of the modified square wave.

An image of fluid flow may be generated by subtracting the label dataset from the control dataset. In an alternative embodiment of the invention, the image of the fluid flow may further be modified by subtracting artifacts of systematic errors from the image.

Another aspect of the invention is a method for compensating for magnetization transfer effects by applying an amplitude modulated magnetic field gradient and amplitude modulated RF irradiation during a label procedure and applying an amplitude modulated control magnetic field gradient and amplitude modulated control RF irradiation during a control procedure. Such compensation for the magnetization transfer effects may be performed in a context of an MR study, such as, for example, an MR imaging study. Furthermore, RF irradiation may be frequency modulated during the label and/or control experiments. An envelope for label RF irradiation for frequency and amplitude modulation may be similar and may be similar to an envelope for amplitude modulation for label magnetic field gradient. An envelope for control RF irradiation for frequency and amplitude modulation may be similar and may be similar to an envelope for amplitude modulation of the control magnetic field gradient. The envelope for label RF irradiation modulation may be an absolute value of the envelope for the control RF irradiation. The envelope for the control RF irradiation may be a modified square wave. In an alternative embodiment, the envelope for the control RF irradiation may be a function other than the square wave, as long as an average control RF irradiation amplitude is at or near zero.

In yet another aspect of the invention, a magnetic resonance apparatus may be constructed and arranged to perform fluid flow imaging. Such apparatus may apply amplitude modulated label RF irradiation and a magnetic field gradient during the labeling procedure. Furthermore, such apparatus may apply amplitude modulated label RF irradiation and a magnetic field gradient during the control procedure. The envelope for applied control magnetic field gradient may be similar or identical to the envelope for applied control RF irradiation. The envelope for applied label RF irradiation and the magnetic field gradient may be the absolute value of the envelope for the control RF irradiation.

In yet another embodiment of the invention, a computer readable medium may be provided. Encoded on the computer readable medium may be instructions that, when executed, direct a method for generating an image of fluid flow obtained from a magnetic resonance system. Such a method may comprise combining a control image received from the control procedure where the amplitude modulated RF irradiation and the magnetic field gradient were applied with a label image received from the labeling procedure where the amplitude modulated RF irradiation and the magnetic field gradient were applied. The control and label images may be combined to create the image of fluid flow by subtracting the label image from the control image.

In another embodiment of the invention, the image of the fluid flow may be further modified by subtracting artifacts of residual or system errors. A dataset for the residual or system errors may be obtained by performing labeling and control procedures in a region different from the region being imaged such as upstream or downstream from the region being imaged. The fluid flow image may be further modified as appropriate for a particular application.

BRIEF DESCRIPTION OF THE DRAWINGS

In the drawings, which are incorporated herein by reference, and in which like elements have been given like reference characters, FIG. 1a schematically illustrates a conventional single-slice MR blood flow mapping study.

DETAILED DESCRIPTION

Figure 1A:
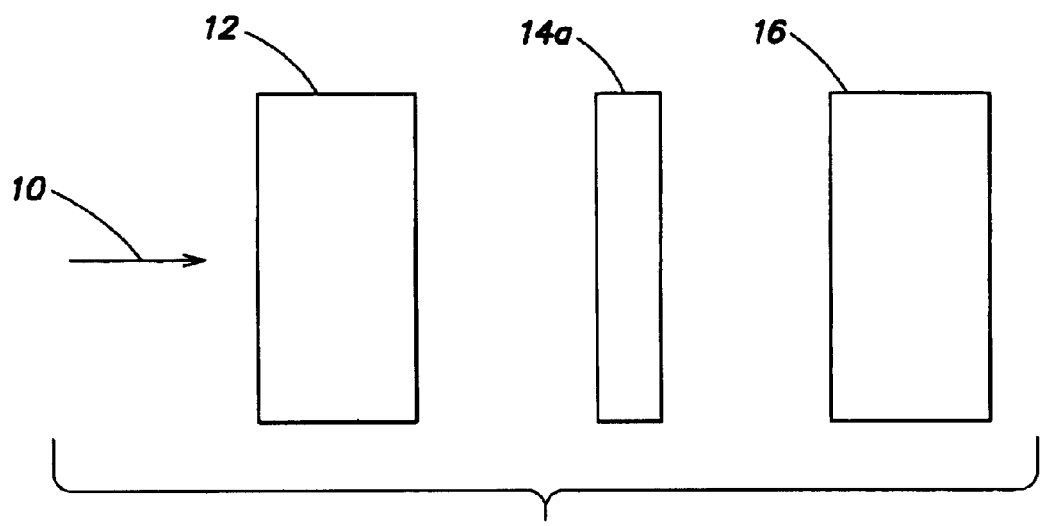
FIG. 1b schematically illustrates how a conventional magnetization transfer compensation scheme fails to compensate for magnetization transfer effects when used in a multislice MR study.

One embodiment of the present invention is described below in relation to FIGS. 2–11. Although the embodiment of FIGS. 2–11 refers to measuring perfusion of blood in the brain, the present invention is not so limited. The invention may also be applied to any MR study of fluid flow or perfusion, whether in live tissue, or under other conditions. Furthermore, the present invention may be used for angiographic studies and other medical and scientific applications, as deemed appropriate by one skilled in the art.

The embodiment of the invention illustrated in FIGS. 2–11 involves proton magnetic resonance imaging of perfusion using water as a freely diffusable tracer. Application of the invention to the measurement of cerebral blood flow (CBF) is detailed in relation to FIGS. 10 and 11.

Although terms "flow" and "perfusion" may sometimes be used interchangeably, perfusion as used herein refers to a diffusable exchange between a fluid and a substance, such as, for example, human tissue. The term "flow" as used herein, generally refers to flow of liquid in vessels, such as, for example, flow of blood in arteries.

Generally, the method of measuring blood flow or perfusion involves labeling proton spins of inflowing water in the arterial blood using magnetic resonance. The blood or water containing hydrogen atoms with spins exchange with bulk water in the brain eventually reaching a state which exhibits a decreased intensity in a brain image, which may be detected using MR imaging techniques. This method of measuring fluid perfusion is generally referred to as Arterial Spin Labeling (ASL). Furthermore, such a method may be performed by applying RF irradiation to a certain volume of blood to label it—such a method is more specifically referred to as Continuous Spin Labeling (CASL). One aspect of the present invention relates to compensating for magnetization transfer effects in a multi-slice or volume study using CASL.

In some arterial spin labeling methods, the labeling is achieved with a brief pulse of RF such that the position of the flowing spins does not change significantly compared to the smallest dimension of the region where the labeling has its greatest effect. These methods are hereafter referred to as "pulsed" ASL. The duration of such pulsed labeling may depend upon the application but in the application of measuring perfusion to the brain, it is typically much less than 100 ms. Other methods for ASL apply RF over a period of time such that spins can readily flow in and out of the region where the labeling has its greatest effect. Often the motion of the fluid is included in the design and optimization of the labeling method. Such ASL methods are hereafter referred to as continuous ASL. The term "continuous" does not preclude modulation of amplitude or another property of the RF or other fields on a time scale faster than the total duration of the RF waveform which helps to achieve the labeling of the flowing fluid. Nor does the term "continuous" preclude a long pause between the last time at which the RF amplitude is greater than zero and the measurement of signal.

For simplicity, in the foregoing description, labeling procedures are described as taking place before control procedures. However, the invention is not so limited. Multiple control and labeling procedures may be performed. Such multiple procedures may be used to generate averaged images, as described below in connection with FIGS. 10 and 11. Labeling and control may be arbitrarily interleaved, as determined by one skilled in the art.

Figure 1B:
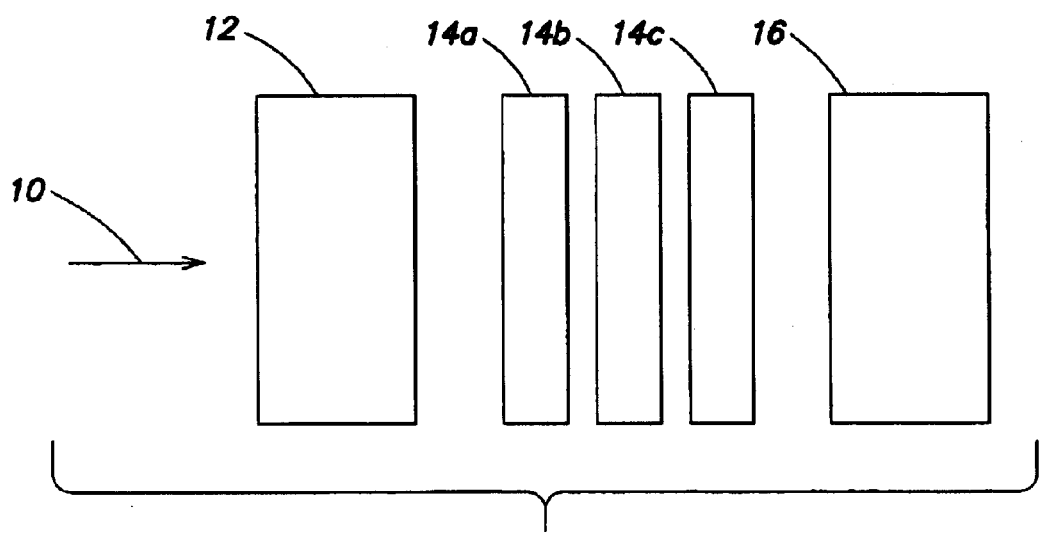

A single-slice ASL imaging technique is now described in connection with FIGS. 1a and 1b. In such a technique, RF irradiation is applied to volume 12 in order to label the spins. The direction of blood flow 10 carries the labeled spins to image slice 14a in the region of interest. In order to compensate for magnetization transfer effects, control RF irradiation may be applied to volume 16, outside of the region of interest. The spins are not labeled in the control procedure, because volume 16 is "downstream" from blood flow. In an alternative embodiment, volume 16 may have no blood flow. The magnetization transfer effects on slice 14a will be the same in the labeling and control procedures only if regions 12 and 16 are equidistant from slice 14a. Both control and labeling irradiation may be constant and applied in the presence of the constant magnetic field gradient.

In order to produce an image of the blood perfusion in slice 14a, images of control and labeling may be taken and combined to produce the perfusion image. The perfusion image may be produced, for example, by subtracting the label image from the control image.

Such a single slice ASL technique may not be applicable to multi-slice studies, as illustrated in connection with FIG. 1b, where imaging of multiple slices 14x is shown schematically. In such a study, distance between the labeling region 12 and a slice and distance between the control region 16 and the slice will not be equal for all the slices—such as, for example, slices 14a and 14c. Therefore, the magnetization transfer effects will not be properly accounted for in the control for those slices, and the images received from combining of control and labeling images will not be accurate.

Previously, a different technique was used to perform multi-slice study. In this conventional technique, a constant magnetic field gradient and a constant RF irradiation may be applied in labeling. In control, however, amplitude modulated RF irradiation may be applied in the presence of the constant magnetic field gradient. This amplitude-modulated RF irradiation is applied to the same region as labeling irradiation, but, because of the amplitude modulation, it generally results in not labeling the spins. The sensitivity of this technique in practice may depend on the strength of the RF irradiation overall.

Figure 2:
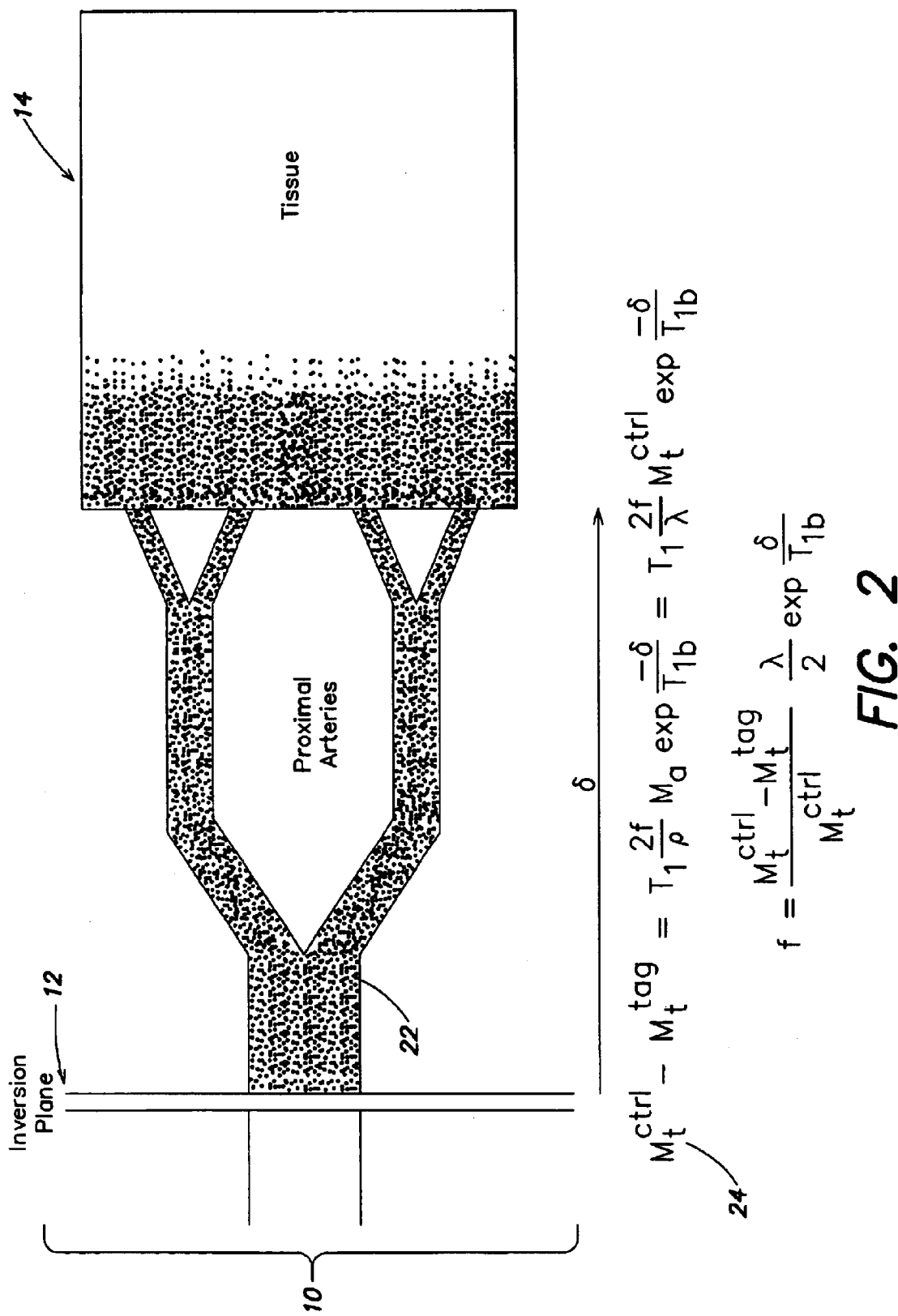
FIG. 2 schematically illustrates blood flow after spin inversion and a Bloch equation for computing spin relaxation effects.

One embodiment of the invention will now be described in connection with FIGS. 2–11. FIG. 2 schematically illustrates blood flow after spin inversion. Spin inversion is performed by RF irradiation in inversion plane 12, after which blood flows through the arteries 22 proximal to tissue 14 in the region of interest; after which blood is perfused in tissue 14.

Spin inversion is achieved by applying magnetic fields in the region where nuclear spins are located. The magnetization, or net magnetic properties of a region containing nuclear spins, changes direction and amplitude depending upon the magnetic fields in that region and times T1 and T2, material specific properties of the substance within the region. The change of the magnetization vector with time is determined by the Bloch equations, which are familiar to those skilled in the art.

These constants—T1 (spin lattice relaxation time) and T2 (spin relaxation time)—may be used, along with other known values, such as the speed of the blood flow, to calculate the magnetization effects on the blood at a particular time t after labeling. Equations describing the behavior of the magnetization vector under various conditions are called Bloch equations.

Equation 24 illustrates behavior of the magnetization vector for the blood flow path illustrated in FIG. 2:

$$M_t^{ctrl} - M_t^{tag} = T_1 \frac{2f}{\rho} M_a \exp\frac{-\delta}{T_{1b}} = T_1 \frac{2f}{\lambda} M_t^{ctrl} \exp\frac{-\delta}{T_{1b}}$$

$$f = \frac{M_t^{ctrl} - M_t^{tag}}{M_t^{ctrl}} \frac{\lambda}{2} \exp\frac{\delta}{T_{1b}}$$

Control RF irradiation may be performed in the same plane 12, however, it may be performed such that the spins are not inverted, while the magnetization transfer effects and unrelated errors are the same as in the labeling procedure.

If imaging is performed at time t illustrated in FIG. 2, the signal from arteries 22 may overpower the perfusion signal in tissue 14. Furthermore, not all areas of tissue 14 are covered by labeled blood. Therefore, it may be beneficial in some applications to delay imaging after labeling for some period of time.

Figure 3:
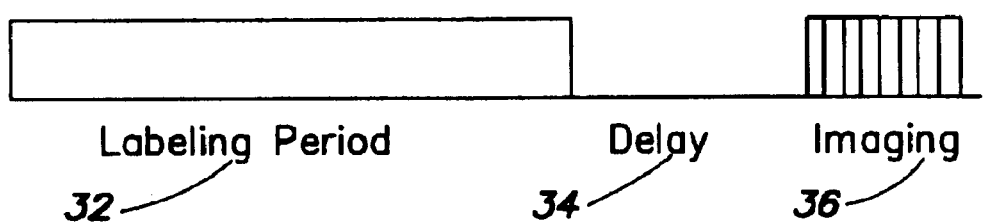
FIG. 3 illustrates a pulse sequence timing diagram for spin labeling and image acquisition.

FIG. 3 illustrates a possible sequence timing diagram for spin labeling and image acquisition. During labeling period 32, labeling RF irradiation is applied to a particular region, after which blood flows into the region of interest during delay 34, and, finally, imaging is performed during period 36. During period 36 one or more slices may be imaged. In an alternative embodiment, volume imaging may be performed and one or more volume images may be taken. "Imaging," as used herein, generally refers to taking data sets from the region of interest and then manipulating them as appropriate, including producing a visual image, if desired. The same or a similar timing diagram may be used for control imaging.

In one embodiment of the invention, labeling RF irradiation may be amplitude and frequency modulated. Furthermore, the labeling magnetic field gradient may also be amplitude modulated. In order to control for magnetization transfer effects properly, the control RF may also be amplitude and frequency modulated and control magnetic field gradient may also be amplitude modulated. For both labeling and control, amplitude modulation of the RF irradiation, frequency modulation of the labeling RF irradiation, and amplitude modulation of the magnetic field gradient may all be performed simultaneously. Each modulation may be performed according to a particular modulation envelope. The term "envelope" is used herein to refer to a function or a curve description according to which a particular parameter may be modulated. The envelope may be a general description, and the real modulation envelope may differ from application to application, as deemed appropriate by one skilled in the art. Furthermore, the particular scale of modulation may depend on the kind of modulation and may differ in each particular implementation.

Figure 4:
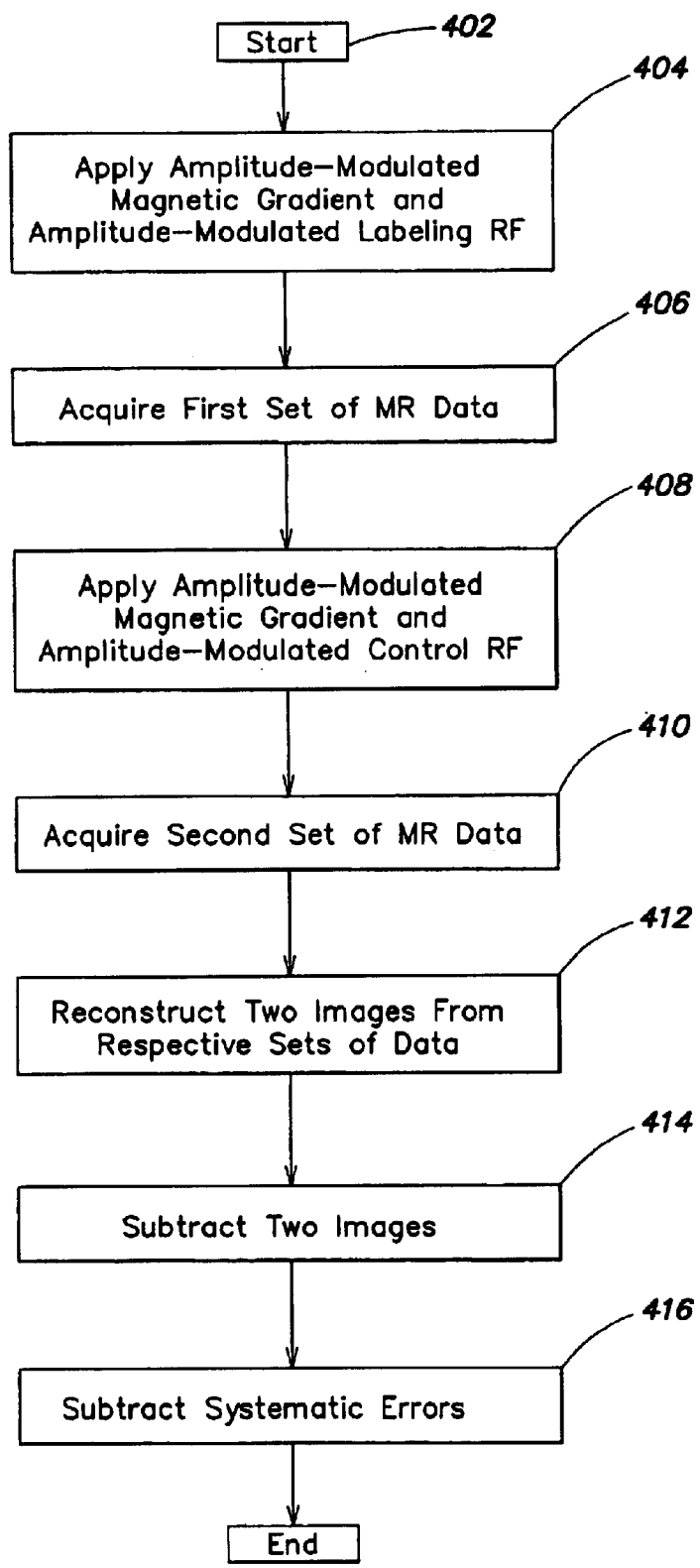
FIG. 4 is a flowchart illustrating one embodiment of the invention.

FIG. 4 is a flowchart illustrating the steps carried out in accordance with one embodiment of the invention. A subject of the MR study and the apparatus are prepared in step 402, after which an amplitude-modulated magnetic field gradient may be applied. Labeling amplitude modulated RF irradiation may be applied to perform spin inversion. Amplitude modulation may be performed according to a labeling modulation envelope. Labeling RF may also be frequency-modulated according to a labeling envelope.

After labeling RF irradiation is applied and a passage of a predetermined delay period (FIG. 3), a first set of MR data may be acquired in the region of interest in step 406. Such a dataset may contain data for MR imaging or other relevant data, as determined by one skilled in the art.

Residual effects of spin labeling may be erased as known in the art, or after a sufficiently long period of time has passed which will erase the effects of spin labeling after the labeling procedure. After the effects of spin labeling are erased, the control magnetic field gradient and the control RF irradiation may be applied again. The control magnetic field gradient and control RF irradiation may be amplitude modulated according to a control modulation envelope. Furthermore, control RF irradiation may be frequency modulated according to the control modulation envelope.

A second set of data may be acquired after the control procedure in step 410. As with the labeling dataset, it may later be converted to an image, if desired. Conversion of datasets to images may be performed in step 412.

A perfusion image may be obtained in step 414 by subtracting the labeling image from the control image. Images or datasets (whichever appropriate) may be further processed by subtracting systematic residual errors in step 416. A particular kind of systematic error is described below in connection with FIG. 11.

One embodiment of the invention illustrated in FIGS. 2–11 is not limited to the steps described above. Any of the steps may be repeated multiple times or in a different order than described. Furthermore, additional steps may be performed. A particular order and number of steps may be determined by one skilled in the art depending on the particular implementation and application of the invention.

Amplitude modulation envelopes for control and labeling are described in connection with FIG. 5. It should be noted that the scale displayed is displayed for illustrative purposes only and may not reflect the actual scale of modulation. Furthermore, the scale of modulation may vary for magnetic field gradient and for RF irradiation and from procedure to procedure.

Control envelope 504 may be generally thought of as a square wave. However, in actual applications, the amplitude cannot change instantaneously, as is in the square wave, therefore envelope 504 is adapted to actual conditions. In general, any kind of envelope may be used, so long as a time scale for the amplitude modulation provided is fast as compared to the time T2 of the fluid and the time needed for the fluid to flow through the region where the effect of the labeling RF irradiation is large. Furthermore, any kind of wave may be used. In an alternative embodiment of the invention, envelope 504 may resemble, for example, a triangular wave, or any other kind of wave, adapted to a particular procedure. For preferred results, control envelope 504 may have average amplitude equal to zero, in order to not perform any spin inversion.

Control envelope 504 may be applied to both the magnetic field gradient and to control RF irradiation. Preferably, modulation may be synchronized between the magnetic field gradient and the RF irradiation. In an alternative embodiment of the invention, control amplitude modulation envelopes may differ for the magnetic field gradient and for the control RF irradiation, but may be similar to each other. The term "similar" may be used to refer to envelopes which are a slight variations of each other. In yet another embodiment of the invention, different modulation envelopes may be used for the magnetic field gradient and for the RF irradiation, so long as the physical properties of the net magnetization effects (FIG. 7) are generally similar to those in the first embodiment of the invention. In yet another embodiment of the invention, different magnetization results may be achieved.

Labeling amplitude modulation envelope 502 may be an absolute value of control modulation envelope 504. In one embodiment of the invention, label amplitude modulation envelope 502 is an absolute value of a modified square function. An average labeling amplitude may be not zero in order to achieve spin labeling. In the embodiment of the invention described above, the average labeling magnitude may be positive, such as shown in FIG. 5. In an alternative embodiment of the invention, the average labeling magnitude may be negative.

Labeling modulation envelope 502 need not be an absolute value of the modified square function. It may be any curve, as appropriate for a particular application. Furthermore, the labeling modulation envelope need not be an absolute value of the control modulation envelope—it may be a similar or an entirely different function, so long as the control RF irradiation mimics the magnetization transfer and other systemic effects of the labeling RF irradiation. Just as with the control modulation envelope, the labeling modulation envelope need not be identical for magnetic field gradient and the RF irradiation, although it is such in the embodiment of the invention illustrated in FIGS. 5 and 6.

Figure 6:
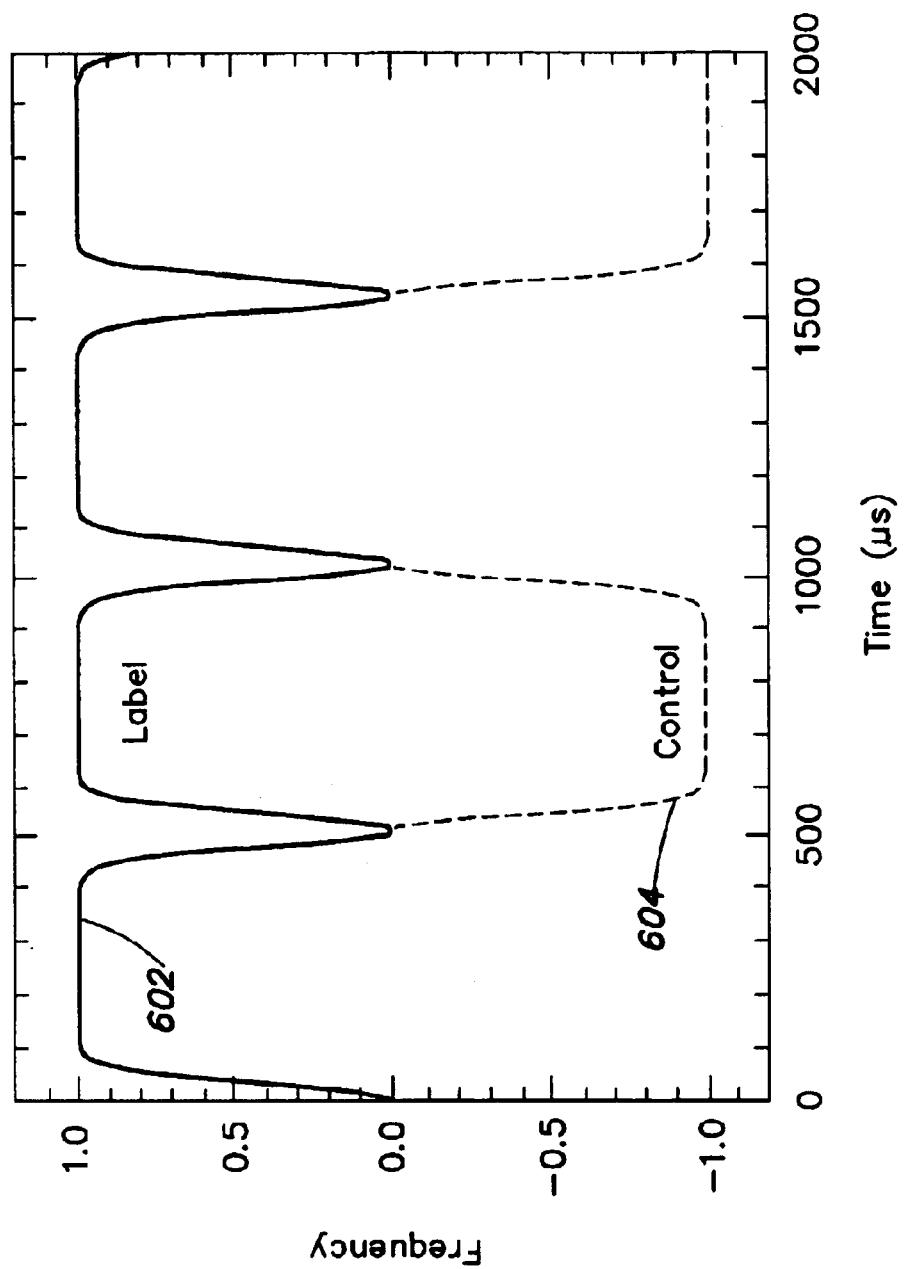
FIG. 6 is a diagram of a frequency modulation envelope for labeling and control RF irradiation.

FIG. 6 is a diagram of a frequency modulation envelope for labeling and control RF irradiation. In one first embodiment of the invention previously described, frequency modulation envelopes 602 and 604 are similar to amplitude modulation envelops 502 and 504, respectively. However, the invention is not limited to such envelopes. In an alternative embodiment of the invention, frequency modulation envelopes may be different from amplitude modulation envelopes. Furthermore, frequency modulation envelope 602 for labeling RF irradiation need not be an absolute value of the control RF irradiation envelope 604. In general, frequency and amplitude modulation envelopes 502, 504, 602, and 504 may be varied depending on requirements of the particular application, as deemed appropriate by one skilled in the art.

Figure 5:
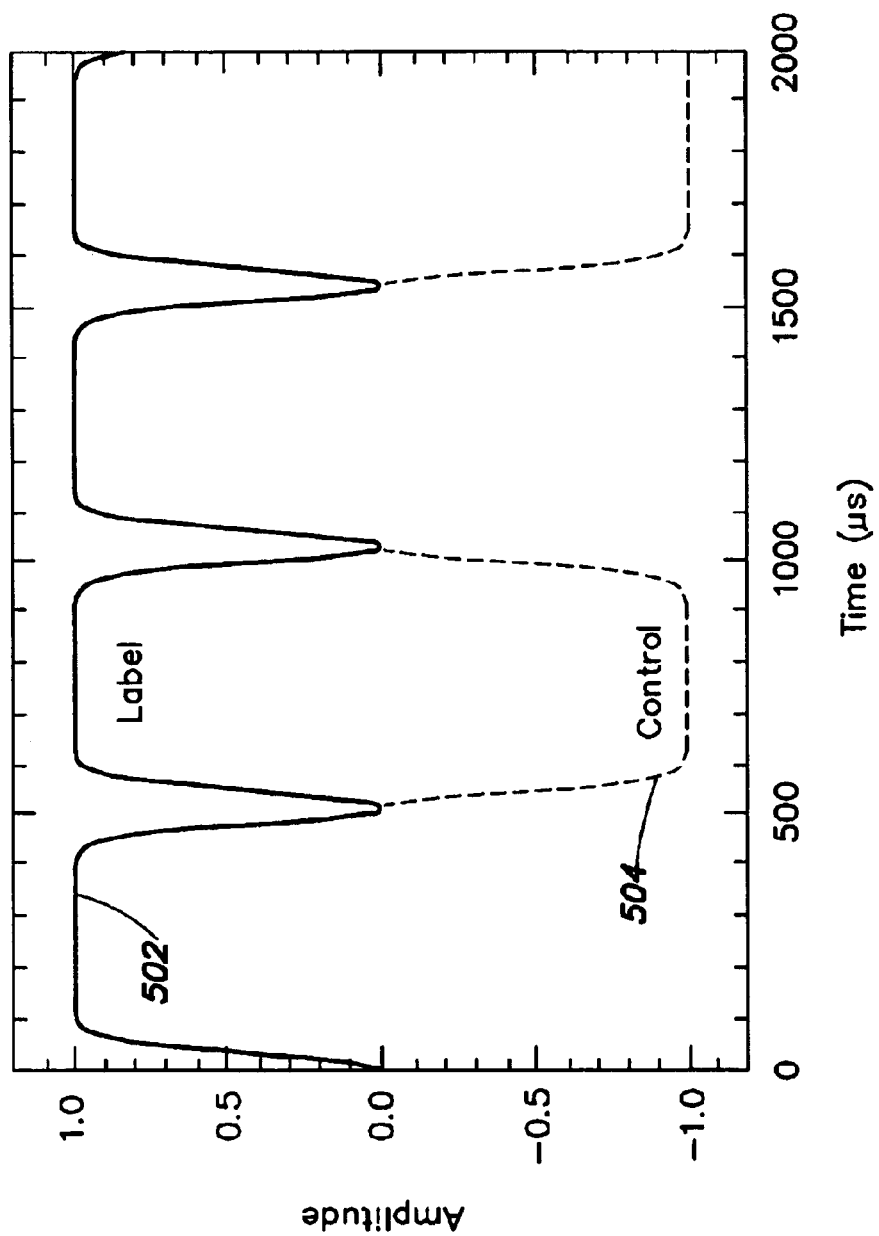
FIG. 5 is a diagram of an amplitude modulation envelope for labeling and control RF irradiation and for control and labeling magnetic field gradient.

In one embodiment of the invention illustrated in FIGS. 5 and 6, both amplitude and frequency modulation is fast compared to T2, in order to avoid decreases in efficiency due to transversal relaxation. In an alternative embodiment of the invention, modulation may be performed as fast as physically possible on the particular equipment used, or may be slower, depending on the fluids and tissues in question.

Figure 7:
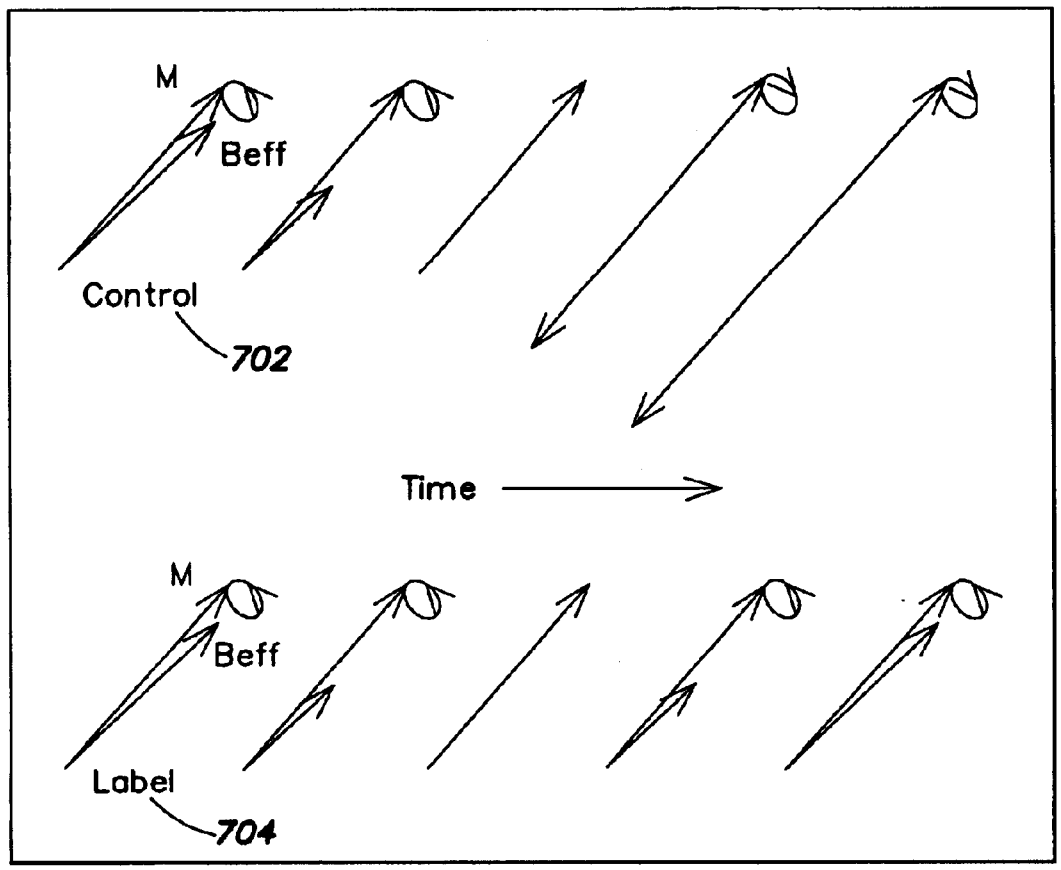
FIG. 7 illustrates a direction of magnetic fields with simultaneous RF and magnetic field gradient amplitude modulation.

FIG. 7 illustrates the direction of magnetic fields with simultaneous RF and magnetic field gradient amplitude modulation and frequency modulation of the RF irradiation.

When viewed in a reference frame spinning at the instantaneous frequency of the RF, a reference frame referred to as the rotating frame by those skilled in the art, the magnetization of the nuclear spins behaves as under the influence of an effective magnetic field having two perpendicular vector components. The component along the direction of the field generated by the large, constant field applied within the MRI scanner is proportional to the difference between the frequency of the spins and the applied RF. The component along the perpendicular direction is equal to the amplitude of the applied RF. Magnetization tends to precess, or rotate, around the effective field. If the effective field direction changes only slowly, the precission of the magnetization will keep it approximately aligned with the effective field direction. The condition where the effective field direction changes only slowly is know to those skilled in the art as "adiabatic".

The simultaneous amplitude and frequency modulation in accordance with embodiments of the invention will affect the RF amplitude and offset frequency in approximately equal proportion such that the direction of the effective field does not change. This preserves the adiabatic condition. When the amplitude modulation averages to a nonzero value, the magnetization will slowly follow the effective field direction. When the amplitude modulation averages to zero, precession in one direction will be canceled by precession in the opposite direction and there will be no net effect of the applied RF irradiation.

Figure 8:
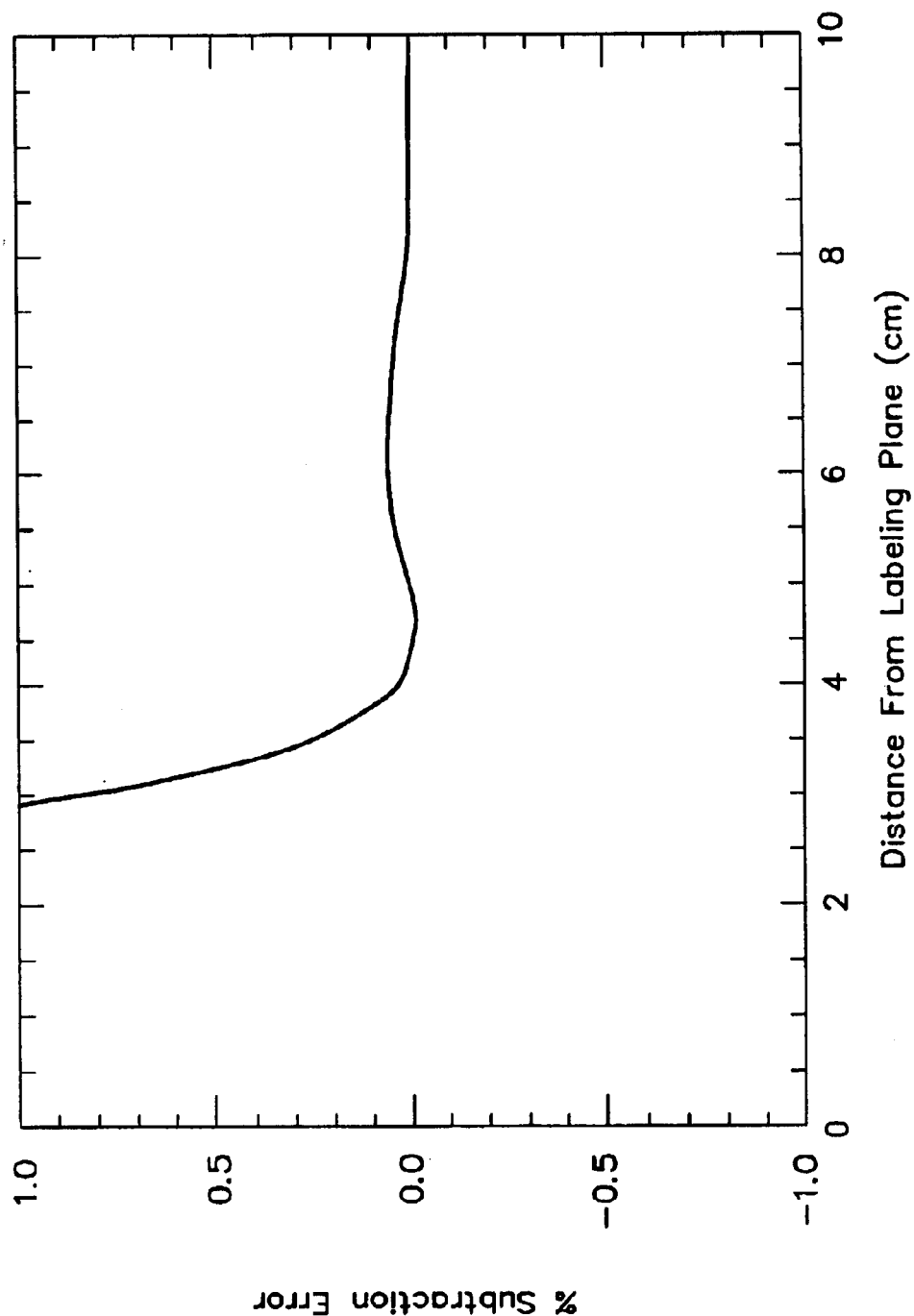
FIG. 8 is a diagram of simulated residual subtraction error.
Figure 9:
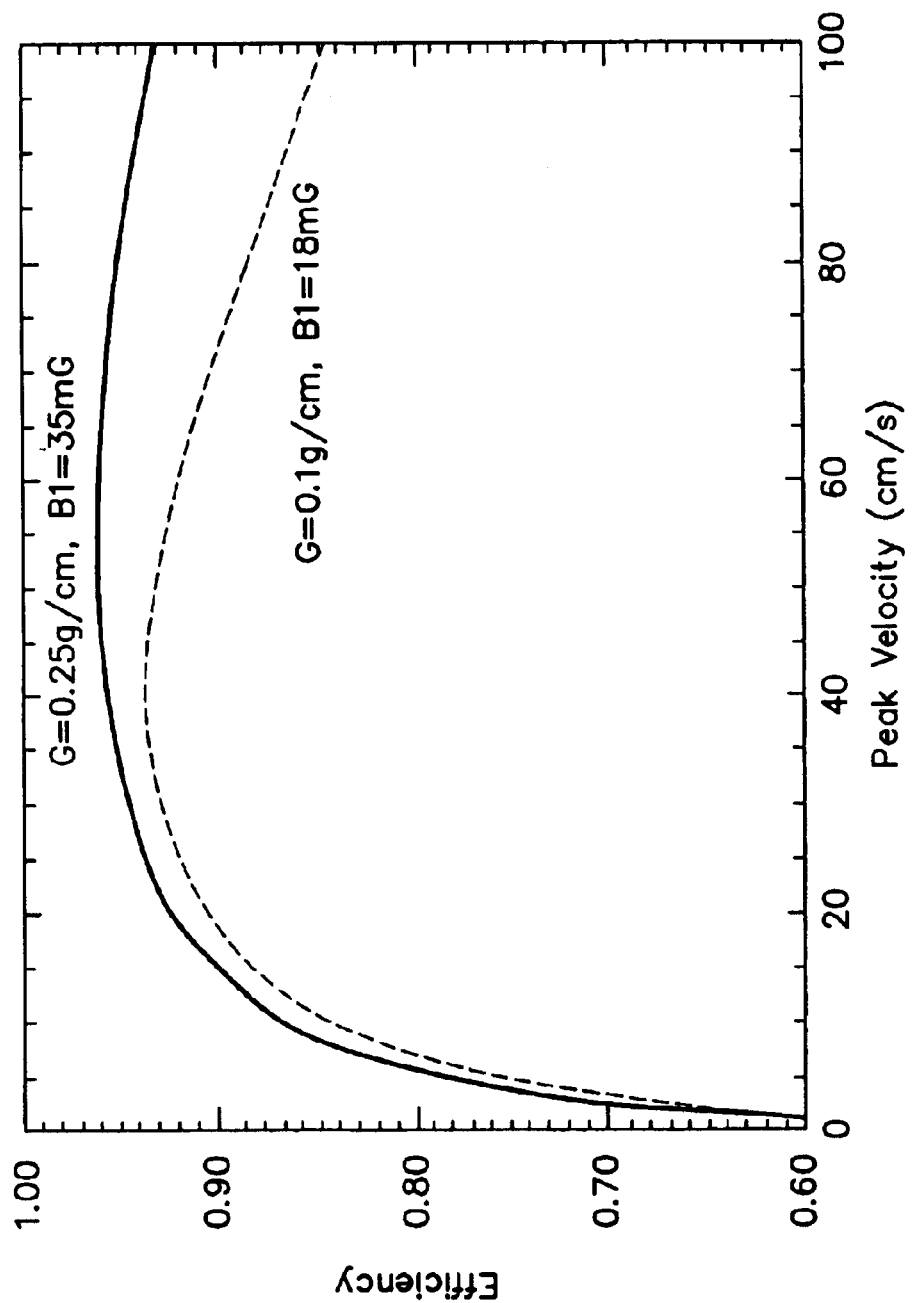
FIG. 9 is a diagram of a simulated efficiency of the first embodiment of the invention.
Figure 10:
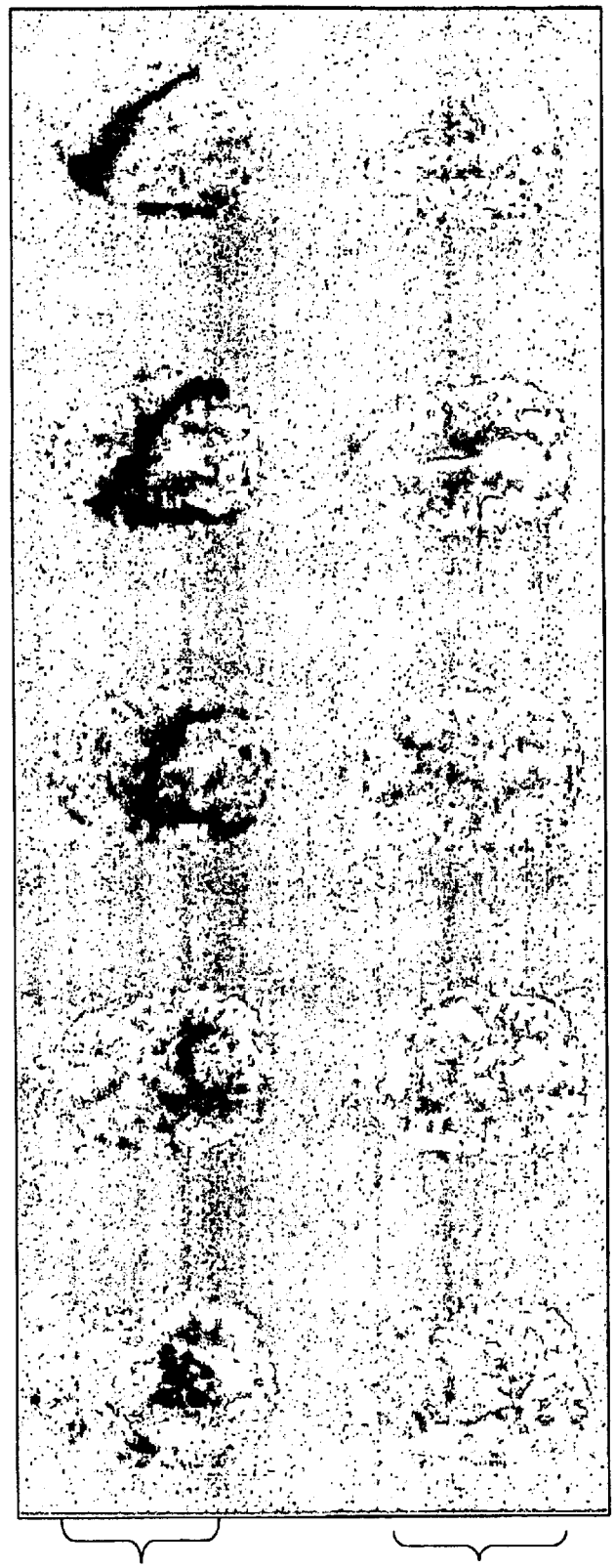
FIG. 10 is an illustration of in-vivo perfusion imaging achieved with the first embodiment of the invention.
Figure 11:
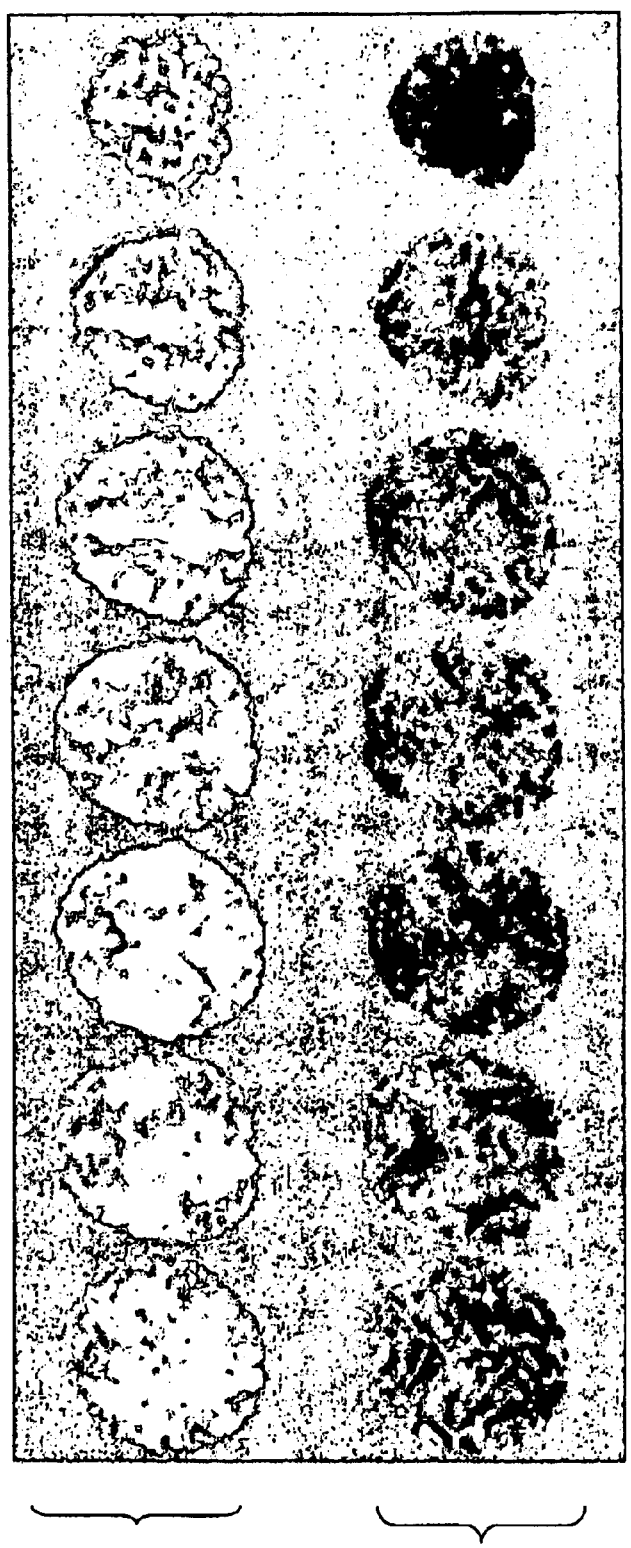
FIG. 11 is an illustration of comparative results of labeling inferior to an imaged region and superior to the imaged region.

FIGS. 8 and 9 illustrate simulated results, while FIGS. 10 and 11 illustrate results of the procedures performed on the human brain (in vivo).

Simulations of inversion efficiency and direct off-resonance effects may be performed using the Bloch equation integration approach. Simulations may be performed for different phases of the modulations, for example, for 16 different phases of the modulation when the spin crosses the inversion plane. In simulation procedures, little variation of efficiency with phase was observed. Different velocities may be simulated and calculations of efficiency may be performed.

Velocities from near zero to over 100 cm/s and higher have been simulated and labeling efficiency for a vessel was calculated assuming a parabolic flow profile. A square wave modulation was selected as the frequency and amplitude modulations envelope because the square wave modulation has the highest power efficiency for this particular application. An approximate square wave modulation at 1 kHz has been used for the simulations. Real gradient systems cannot switch instantaneously, so the edges of the square wave transitions have been smoothed by appending half gaussians to the flat portion of the modulation (FIGS. 5 and 6). In addition to the inversion efficiency, the direct effects of the applied fields to static tissue with a T1 time and a and T2 time typical of brain tissue have also been stimulated.

FIG. 8 is a diagram of simulated residual subtraction error. Simulated residual subtraction error of B1 of 18 mG and G of 0.1 gauss/cm is shown as a function of distance from the labeling plane. For the parameters shown, subtraction error for the control approach is much less than the perfusion signal at a distance of 4 cm from the labeling plane.

FIG. 9 is a diagram of a simulated efficiency of one embodiment of the invention illustrated in FIG. 4. Simulated efficiency of greater than 90% has been achieved over a wide range of velocities even with RF amplitude reduced to 18 mG (FIG. 9). The modulation approach of one embodiment of the invention is not affected by strong artifacts near the center frequency, has been shown to mimic the continuous flow driven adiabatic inversion efficiency with constant RF and gradient amplitude, in vivo. This embodiment removed systematic errors across a volume much larger than the constant RF and gradient approach.

One embodiment of the invention has been implemented in-vivo on a General Electric VH/I 3 Tesla scanner. The invention is not limited to 3 Tesla scanner, and may be implemented on a wide range of MR apparatuses. Imaging has been performed with an echoplanar imaging sequence with a slice thickness of 7 mm, a 24 cm field of view, and an acquisition matrix of 64×64. The spin labeling was performed with the following timing: 1.3 second after a selective spatial saturation, the adiabatic RF irradiation was applied for 1.5 seconds and stopped 1.2 seconds before acquisition. Images were acquired with a TR of 5 seconds and each labeling and control image was averaged 12 times for a total of 2 minutes of scanning.

FIG. 10 is an illustration of in-vivo perfusion imaging achieved with one embodiment of the invention. Residual errors in the timing and shape of the RF and gradients caused a severe artifact on the subtraction images in certain specific locations (images 110). These and other errors may show up in other implementations of the invention.

Such errors may be corrected by applying a small offset to the frequency of the RF irradiation. Such an offset may be constant and not affect the overall effectiveness of the RF irradiation if the offset is relatively small compared to the overall frequency of the RF irradiation. In an alternative embodiment, the offset may be in a different proportion to the RF frequency. In yet another embodiment of the invention, a solution other than the frequency offset may be used to cure the undesired errors and unrelated effects.

In an in-vivo implementation of one embodiment of the invention, a 100 Hz offset to the frequency of the RF was used and it eliminated the artifacts of the undesired errors and produced images demonstrating strong perfusion contrast, as shown in images 1012.

Additional errors may be present in the system, whether due to various imperfections, such as, for example, imperfections in the apparatus of a particular embodiment. Various mechanisms may be used to correct for some or all of those errors.

Some residual errors may be detected if labeling and control are applied downstream to the region of interest being imaged. FIG. 11 is an illustration of comparative results of labeling upstream to an imaged region and downstream to the imaged region.

For detection of residual errors, labeling of spins may be applied to a region downstream to the region of interest being imaged. In such a labeling, of course, no actual tissue perfusion is detected, because there may be no blood flow from the downstream region to the region of interest. Likewise, control RF irradiation may be applied to the downstream region. Theoretically, in case of downstream imaging, labeling and control datasets should be identical. However, in actual implementations that may be not the case due to residual and systematic errors. When labeling images are subtracted from control images, a small residual signal may still be present, as shown in images 1112.

If desired, the data about residual or systematic errors may be subtracted from the perfusion image resulting from subtraction of labeling and control images. After these errors are removed, images illustrating blood perfusion may be received, as shown in images 1110.

Additional image processing may be performed on the datasets received from the procedures. In the in-vivo procedures in the first embodiment of the invention, all recorded raw echo amplitudes were saved and transferred to a workstation for processing. Software written within the Instructive Data Language (IDL) environment may be used to reconstruct the images. Various transformations may be applied to images, as appropriate for a particular implementation. Correction for image distortion and alternate k-space line errors may be performed on each image on the basis of data acquired during phase-encoded reference imaging. A side effect of this correction may be that image regions in which insufficient MR signal is present may be set to zero to allow for accurate measurement of the magnetic field.

For labeling and control, magnitude images may be averaged. Gray and white matter may be automatically selected using the cerebrospinal fluid (CSF) suppression and CSF-white matter suppression.

In the multi-slice study, CBF may be calculated from images acquired with and without arterial spin labeling. The averaged labeled images may be first subtracted from the averaged control images and then divided by the signal intensity on an image obtained in the absence of off-resonance saturation.

The present invention is not limited to a particular implementation of the apparatus or dataset reconstruction system. It may be implemented on a variety of scanners and other MR equipment. Furthermore, it is not limited to MR imaging studies, and may be used for any MR study, as deemed appropriate by one skilled in the art.

The invention may also be used for magnetic resonance angiography, the selective imaging of blood vessels by MRI. The invention may furthermore be used in measurement of flow in pipes or porous media and in a variety of other applications.

The software implementation of the system is not limited to the implementation described above. Both system controls and an image reconstruction system may be implemented on a variety of computers or computer systems.

A computer system for implementing an MR apparatus control and/or imaging system as a computer program typically includes a main unit connected to both an output device which displays information to a user and an input device which receives input from a user. The main unit generally includes a processor connected to a memory system via an interconnection mechanism. The input device and output device also are connected to the processor and memory system via the interconnection mechanism.

It should be understood that one or more output devices may be connected to the computer system. Example output devices include a cathode ray tube (CRT) display, liquid crystal displays (LCD), printers, communication devices such as a modem, and audio output. It should also be understood that one or more input devices may be connected to the computer system. Example input devices include a keyboard, keypad, track ball, mouse, pen and tablet, communication device, and data input devices such as sensors. It should be understood the invention is not limited to the particular input or output devices used in combination with the computer system or to those described herein.

The computer system may be a general purpose computer system which is programmable using a computer programming language, such as C++, Java, or other language, such as a scripting language or assembly language. The computer system may also include specially programmed, special purpose hardware. In a general purpose computer system, the processor is typically a commercially available processor, of which the series x86 and Pentium processors, available from Intel, and similar devices from AMD and Cyrix, the 680X0 series microprocessors available from Motorola, the PowerPC microprocessor from IBM and the Alpha-series processors from Digital Equipment Corporation, are examples. Many other processors are available. Such a microprocessor executes a program called an operating system, of which WindowsNT, UNIX, DOS, VMS and OS8 are examples, which controls the execution of other computer programs and provides scheduling, debugging, input/output control, accounting, compilation, storage assignment, data management and memory management, and communication control and related services. The processor and operating system define a computer platform for which application programs in high-level programming languages are written.

A memory system typically includes a computer readable and writeable nonvolatile recording medium, of which a magnetic disk, a flash memory and tape are examples. The disk may be removable, known as a floppy disk, or permanent, known as a hard drive. A disk has a number of tracks in which signals are stored, typically in binary form, i.e., a form interpreted as a sequence of one and zeros. Such signals may define an application program to be executed by the microprocessor, or information stored on the disk to be processed by the application program. Typically, in operation, the processor causes data to be read from the nonvolatile recording medium into an integrated circuit memory element, which is typically a volatile, random access memory such as a dynamic random access memory (DRAM) or static memory (SRAM). The integrated circuit memory element allows for faster access to the information by the processor than does the disk. The processor generally manipulates the data within the integrated circuit memory and then copies the data to the disk when processing is completed. A variety of mechanisms are known for managing data movement between the disk and the integrated circuit memory element, and the invention is not limited thereto. It should also be understood that the invention is not limited to a particular memory system.

It should be understood the invention is not limited to a particular computer platform, particular processor, or particular high-level programming language. Additionally, the computer system may be a multiprocessor computer system or may include multiple computers connected over a computer network. It should be understood that each module (e.g. 100, 102a, 104a, 106, and 105) in FIG. 1A may be separate modules of a computer program, or may be separate computer programs. Such modules may be operable on separate computers. Data (e.g. 100 and 104a) may be stored in a memory system or transmitted between computer systems. The invention is not limited to any particular implementation using software or hardware or firmware, or any combination thereof. The various elements of the system, either individually or in combination, may be implemented as a computer program product tangibly embodied in a machine-readable storage device for execution by a computer processor. Various steps of the process may be performed by a computer processor executing a program tangibly embodied on a computer-readable medium to perform functions by operating on input and generating output. Computer programming languages suitable for implementing such a system include procedural programming languages, object-oriented programming languages, and combinations of the two.

Having now described several embodiments, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention.

What is claimed is:

1. A method for conducting an MR fluid flow study, said method comprising:
    simultaneously applying a first amplitude modulated magnetic field gradient and a first amplitude modulated RF irradiation to continuously change for a first period of time a signal from said fluid before it flows into a region of interest;
    acquiring first data for at least a portion of the region of interest;
    simultaneously applying a second amplitude modulated magnetic field gradient and a second amplitude modulated RF irradiation to continuously change for a second period of time a signal from said fluid before it flows into the region of interest;
    acquiring second data for the at least a portion of the region of interest; and
    generating compensated fluid flow data for the at least a portion of the region of interest, wherein the fluid flow data is a function of at least the first data and the second data.

2. The method of claim 1, wherein the signals from the fluid are NMR signals.

3. The method of claim 2, wherein an envelope for the amplitude modulation of the first RF irradiation is an absolute value of an envelope for the amplitude modulation of the second RF irradiation.

4. The method of claim 2, wherein an average amplitude for the first RF irradiation is not zero.

5. The method of claim 4, wherein the average amplitude for the first RF irradiation is above zero.

6. The method of claim 5, wherein the average amplitude for the first RF irradiation is below zero.

7. The method of claim 2, wherein an average amplitude for the second RF irradiation is zero.

8. The method of claim 1 wherein, the first amplitude modulated RF irradiation is frequency modulated whereby the first amplitude modulated magnetic field gradient create an adiabatic condition.

9. The method of claim 1, wherein an envelope for the amplitude modulation of the second RF irradiation is similar to an envelope for the amplitude modulation of the second magnetic field gradient.

10. The method of claim 1, wherein the second RF irradiation is frequency modulated.

11. The method of claim 10, wherein an envelope for frequency modulation of the second RF irradiation is similar to an envelope for amplitude modulation of the second RF irradiation.

12. The method of claim 1, wherein an envelope for amplitude modulation of the second RF irradiation is a modified square wave.

13. The method of claim 1, wherein an average amplitude for the first RF irradiation is not zero.

14. The method of claim 13, wherein the average amplitude for the first RF irradiation is positive.

15. The method of claim 13, wherein an envelope for the first RF irradiation is an absolute value of a modified square wave.

16. The method of claim 1, wherein the first data is collected during a control period and the second data is collected during a labeling period.

17. The method of claim 16, wherein an envelope for amplitude modulation of the first RF irradiation is similar to an envelope for amplitude modulation of the first magnetic field gradient.

18. The method of claim 16, wherein an envelope for amplitude modulation of the second RF irradiation is similar to an envelope for amplitude modulation of the second magnetic field gradient.

19. The method of claim 16, wherein an envelope for amplitude modulation of the first magnetic field gradient is an absolute function of an envelope for amplitude modulation of the second magnetic field gradient.

20. The method of claim 19, wherein the envelope for amplitude modulation of the second magnetic field gradient is a modified square wave.

21. The method of claim 1, wherein generating compensated fluid flow data comprises: generating a fluid flow image, including substracting the first fluid flow data from the second fluid flow data.

22. The method of claim 21, wherein generating the fluid flow image further comprises subtracting a representation of a systematic error from the fluid flow image.

23. The method of claim 1, wherein a second RF irradiation has frequency offset.

24. The method of claim 23, wherein the frequency offset is small compared to the frequency of the second RF irradiation.

25. A method for compensating for at least the magnetization transfer effects, comprising the following steps:
    applying an amplitude modulated magnetic field gradient;
    applying an amplitude modulated control RF irradiation, wherein an envelope for the amplitude modulation of the control RF irradiation is similar to an envelope for the amplitude modulation of the magnetic field gradient;
    applying an amplitude modulated labeling RF irradiation.

26. The method of claim 25 wherein the labeling RF irradiation and the amplitude modulated magnetic field gradient are continuous signals.

27. The method of claim 26, wherein an average amplitude for the control RF irradiation is zero.

28. The method of claim 26, wherein the envelope for the amplitude modulation of the control RF irradiation is a modified square wave.

29. The method of claim 25, wherein the compensating for at least the magnetization transfer effects is performed in the context of an MR imaging study.

30. The method of claim 29, wherein an envelope for the amplitude modulation of the labeling RF irradiation is an absolute value of an envelope for the amplitude modulation of the control RF irradiation.

31. The method of claim 29, wherein an average amplitude for the label RF irradiation is nonzero.

32. The method of claim 31, wherein the average amplitude for the label RF is positive.

33. The method of claim 25, wherein the labeling RF irradiation is frequency modulated.

34. The method of claim 33, wherein the labeling RF irradiation is frequency modulated according to an envelope that is similar to an envelope for the amplitude modulation for labeling RF.

35. The method of claim 25, wherein the control RF irradiation is frequency modulated.

36. The method of claim 35, wherein the control RF irradiation is frequency modulated according to an envelope that is similar to an envelope for the amplitude modulation for labeling RF.

37. An MR apparatus constructed and arranged to perform fluid flow imaging, said scanner comprising:
- a module for generating amplitude modulated labeling RF irradiation; and
- a module for generating an amplitude modulated magnetic field gradient wherein the amplitude modulation of the magnetic field gradient is similar to amplitude modulation of the labeling RF irradiation.

38. The MR apparatus of claim 37, wherein the module for generating the amplitude modulated labeling RF irradiation is further adapted to generate amplitude modulated control RF irradiation.

39. The MR apparatus of claim 38, wherein an envelope of the amplitude modulated labeling RF irradiation is an absolute value of an envelope of the amplitude modulated control RF irradiation.

40. The MR apparatus of claim 38, wherein the envelope of the amplitude modulated control RF irradiation is a modified square wave.

41. The MR apparatus of claim 38, wherein an average amplitude for the labeling RF irradiation is not zero.

42. The MR apparatus of claim 41, wherein the average amplitude for the labeling RF irradiation is positive.

43. The MR apparatus of claim 38, wherein an average amplitude for control RF irradiation is zero.

44. The MR apparatus of claim 38, further adapted to generate a frequency modulated control RF irradiation.

45. The MR apparatus of claim 44, wherein an envelope for frequency modulation of the control RF irradiation is similar to an envelope for amplitude modulation of the control RF irradiation.

46. The MR apparatus of claim 37, further adapted to generate a frequency modulated labeling RF irradiation.

47. The MR apparatus of claim 46, wherein an envelope for frequency modulation of the labeling RF irradiation is similar to an envelope for amplitude modulation of the labeling RF irradiation.

48. A computer readable medium encoding instructions that, when executed, direct a method for generating an image of fluid flow obtained from an MR system, said method comprising:
- generating a label image from an MR data obtained by spin labeling flowing fluid using an amplitude modulated labeling RF irradiation and amplitude-modulated magnetic field gradient controlled to create an adiabatic condition;
- generating a control image from an MR data obtained by simulating at least magnetization transfer effects using amplitude modulated control RF irradiation and an amplitude modulated magnetic field gradient; and
- generating the image of the fluid flow by subtracting the label image from the control image.

49. The computer-readable medium of claim 48, wherein said method further comprises generating the image of the fluid flow by subtracting additional error data from the image of the fluid flow.

50. The computer-readable medium of claim 49, wherein said additional error data is obtained by performing labeling and control procedures in a region posterior to an imaging region.

51. The computer readable medium of claim 48 wherein the amplitude modulated RF irradiation an amplitude modulated magnetic field gradient that generate the labeling image are energized simultaneously.

52. The computer readable medium of claim 51 wherein the amplitude modulated RF irradiation and amplitude modulated magnetic field gradient the generate the control image are energized simultaneously.

53. The computer readable medium of claim 52 wherein, for generation of the control image, the amplitude modulated RF irradiation is frequency modulated with an envelope proportional to the amplitude modulation envelope of the magnetic field gradient.

54. The computer readable medium of claim 51 wherein, for generation of the labeling image, the amplitude modulated RF irradiation is frequency modulated with an envelope proportional to the amplitude modulation envelope of the magnetic field gradient.

* * * * *